(12) United States Patent
Chaivipas

(10) Patent No.: US 8,829,961 B2
(45) Date of Patent: Sep. 9, 2014

(54) CLOCK GENERATOR

(71) Applicant: Fujitsu Limited, Kawasaki (JP)

(72) Inventor: Win Chaivipas, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/872,542

(22) Filed: Apr. 29, 2013

(65) Prior Publication Data

US 2013/0335126 A1    Dec. 19, 2013

(30) Foreign Application Priority Data

Jun. 14, 2012    (JP) .................. 2012-135185

(51) Int. Cl.
*H03L 7/06*    (2006.01)
*H03K 5/06*    (2006.01)
*H03L 7/081*    (2006.01)

(52) U.S. Cl.
CPC ............... *H03K 5/06* (2013.01); *H03L 7/0812* (2013.01)
USPC ............................ 327/158; 327/149; 327/175

(58) Field of Classification Search
CPC .................... H03L 7/081–7/0818; H03K 5/06; H03K 5/1565; H03K 7/08
USPC .................. 327/149, 153, 158, 161, 172–176
See application file for complete search history.

(56) References Cited

U.S. PATENT DOCUMENTS

| | | | |
|---|---|---|---|
| 5,883,534 A | 3/1999 | Kondoh et al. | |
| 6,703,879 B2* | 3/2004 | Okuda et al. | 327/158 |
| 7,414,445 B2* | 8/2008 | Heyne | 327/158 |
| 7,821,316 B2* | 10/2010 | Fiedler | 327/231 |
| 8,519,758 B2* | 8/2013 | Lee et al. | 327/158 |

FOREIGN PATENT DOCUMENTS

| | | |
|---|---|---|
| JP | 09-321614 A | 12/1997 |
| JP | 2004-328448 A | 11/2004 |
| JP | 2008-136031 A | 6/2008 |

* cited by examiner

*Primary Examiner* — Patrick O'Neill
(74) *Attorney, Agent, or Firm* — Arent Fox LLP

(57) ABSTRACT

A clock generator includes a delay circuit to have 2N delays, in which a delay time from a first delay of the 2N delays to a last delay is set to a length of one cycle of an input; a first phase-detector to detect a first phase-difference between the input and an output from the last delay; a first charge-pump to generate a first current according to the first phase-difference; a first loop-filter to adjust a delay amount of each of the 2N delays, based on a voltage of the first current; a second phase-detector to detect a second phase-difference between the input and an output from an Nth delay; a second charge-pump to generate a second current according to the second phase-difference; and a second loop-filter to adjust a duty ratio of an output from each of the 2N delays, based on a voltage of the second current.

12 Claims, 11 Drawing Sheets

INPUT CLOCK TO INVERTER 14A

OUTPUT CLOCK FROM INVERTER 14D

OUTPUT CLOCK FROM INVERTER 14F

100

200

CLOCK GENERATOR

CROSS-REFERENCE TO RELATED APPLICATION

This application is based upon and claims the benefit of priority from the prior Japanese Patent Application No. 2012-135185 filed on Jun. 14, 2012, the entire contents of which are incorporated herein by reference.

FIELD

The embodiments discussed herein are related to a clock generator.

BACKGROUND

There has been a clock generator in which a delay clock "rise" and a delay clock "fall" are respectively output from, for example, an N-th stage and a 2N-th stage of a delay circuit by two selectors, after which the rise delay clock and the fall delay clock are respectively divided by two by a rise flip-flop and a fall flip-flop and then an exclusive OR of the resulting two divided-by-two clocks is output by an exclusive OR circuit.

This conventional clock generator generates sampling clocks with a duty ratio of 50% that differs from a basic clock only in the phase (see Japanese Laid-open Patent Publication No. 2004-328448, for example).

SUMMARY

According to an aspect of the invention, a clock generator includes a delay circuit configured to have 2N delay stages, in which a delay time from a first delay stage of the 2N delay stages to a last delay stage of the 2N delay stages is set to a length of a time of one cycle of an input clock input to the delay circuit, N being an integer; a first phase detector configured to detect a first phase difference between the input clock to the first delay stage and an output clock from the last delay stage; a first charge pump configured to generate a first current according to the first phase difference; a first loop filter configured to adjust an amount of delay applied to each of the 2N delay stages, based on a first voltage obtained by integrating the first current; a second phase detector configured to detect a second phase difference between the input clock to the first delay stage and an output clock from an Nth delay stage; a second charge pump configured to generate a second current according to the second phase difference; and a second loop filter configured to adjust a duty ratio of an output clock from each of the 2N delay stages, based on a second voltage obtained by integrating the second current.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Embodiments to which a clock generator in the present disclosure is applied will be described.

First, a general clock generator will be described with reference to FIGS. 1 and 2 before delay locked loops (DLLs) in a first embodiment and a second embodiment will be described.

Figure 1:
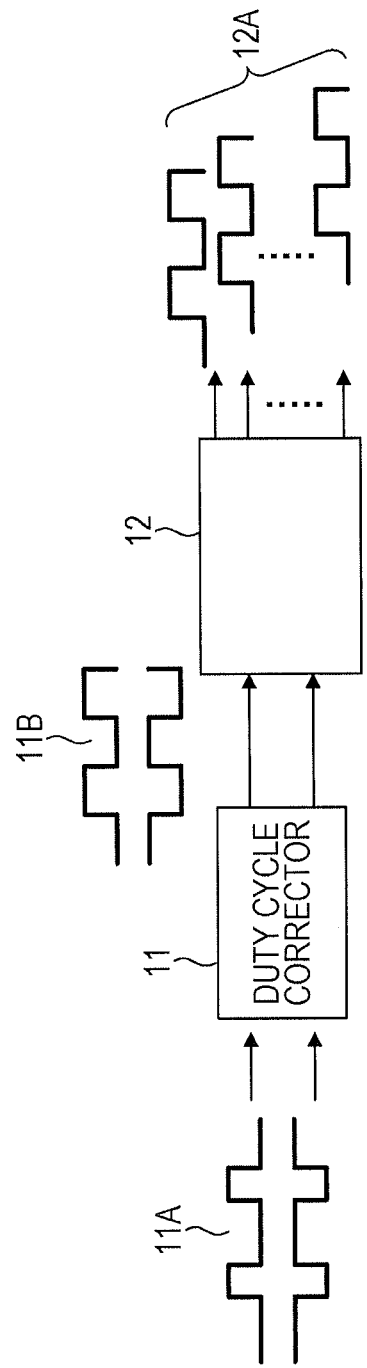
FIG. 1 is a block diagram illustrating an example of a general clock generator.

FIG. 1 is a block diagram illustrating an example of a general clock generator.

The general clock generator 10 includes a duty cycle corrector 11 and a DLL 12.

The duty cycle corrector 11 corrects the duty ratios of input clocks 11A and outputs clocks with the corrected duty ratios. In FIG. 1, differential input clocks 11A with duty ratios of less than 50% are corrected by the duty cycle corrector 11 and the corrected clocks are output as output clocks 11B with a duty ratio of 50%.

The output clocks 11B with the duty ratio corrected by the duty cycle corrector 11 are input into the DLL 12, by which their phases are adjusted.

The DLL 12 generates and outputs multi-phase clocks 12A, which have different phases.

Figure 2:
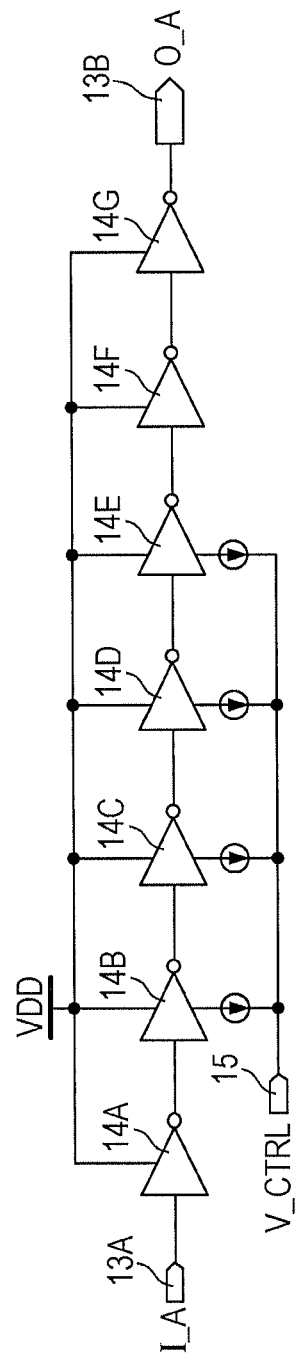
FIG. 2 illustrates the structure of a delay control circuit included in the general clock generator.

FIG. 2 illustrates the structure of a delay control circuit 13. The delay control circuit 13 is included in the DLL 12 illustrated in FIG. 1.

The delay control circuit 13 includes an input terminal 13A, an output terminal 13B, inverters 14A to 14G, and a control signal input terminal 15.

The input terminal 13A is used to input a clock into the delay control circuit 13. The inverter 14A, which is at the first stage of the delay control circuit 13, is connected to the input terminal 13A. A clock received by the input terminal 13A is input into the inverter 14A.

The output terminal 13B is connected to an output terminal of the inverter 14G, which is at the last stage of the delay control circuit 13. The output terminal 13B receives a clock from the inverter 14G and externally output the received clock.

The seven inverters 14A to 14G are connected in series, to each of which a power supply voltage VDD is supplied. An input terminal of the inverter 14A at the first stage is connected to the input terminal 13A of the delay control circuit 13. An output terminal of the inverter 14G at the last stage is connected to the output terminal 13B of the delay control circuit 13.

The inverters 14A, 14F, and 14G operate on the power supply voltage VDD, so they give a fixed delay time to a clock.

The inverters 14B, 14C, 14D, and 14E are connected to the control signal input terminal 15. When the value of a voltage to be applied to the control signal input terminal 15 is controlled, it becomes possible to control an amount by which a clock to be input into the inverters 14B, 14C, 14D, and 14E is delayed.

Figure 3A:
FIGS. 3A to 3C illustrate examples of clock waveforms in the delay control circuit included in the general clock generator.
Figure 3B:
Figure 3C:

FIGS. 3A to 3C illustrate examples of clock waveforms in the delay control circuit 13.

FIG. 3A illustrates an example of the waveform of a clock to be input into the inverter 14A. FIG. 3B illustrates an example of the waveform of a clock output from the inverter 14D. FIG. 3C illustrates an example of the waveform of a clock output from the inverter 14F.

As illustrated in FIG. 3A, the inverter 14A receives an ideal clock with a duty ratio of 50%, the waveform of which is not deformed. For example, this type of clock is generated by a phase locked loop (PLL) and its duty ratio is then corrected to 50% by the duty cycle corrector 11 illustrated in FIG. 1, after which the corrected clock is input into the delay control circuit 13 included in the DLL 12 (see FIG. 1).

FIG. 3B illustrates an example of a clock output from the inverter 14D;
the forms of the rising edge and falling edge are obtuse. The clock output from the inverter 14D is a clock obtained by delaying the clock input into the input terminal 13A by the inverters 14A, 14B, 14C, and 14D.

These obtuse rising edge and falling edge are generated by, for example, a change in slew rate that occurs when the clock input into the input terminal 13A is delayed by the inverters 14A, 14B, 14C, and 14D.

FIG. 3C illustrates an example of a clock output from the inverter 14F; although the obtuse forms of the rising edge and falling edge have been improved by the inverter 14F, the duty ratio is less than 50%.

This change in duty ratio is caused because the duty ratio may change while the clock is delayed by the inverters 14A to 14F. Although the waveform in FIG. 3C has a duty ratio of less than 50%, the duty ratio may be increased to more than 50%.

As described above, in the general clock generator 10 illustrated in FIG. 1, the duty cycle corrector 11 corrects the duty ratios of clocks, after which the DLL 12 generates and outputs the multi-phase clocks 12A.

However, the duty ratio of a clock may change in the delay control circuit 13 included in the DLL 12 as illustrated in FIG. 3C, so the duty ratios of the multi-phase clocks 12A output from the DLL 12 may differ from the duty ratios corrected by the duty cycle corrector 11.

Accordingly, it is difficult for the clock generator 10 not only to adjust the clock phase but also to correct the duty ratio.

It can also be thought that the duty cycle corrector 11 and DLL 12 are exchanged so that a clock with a phase corrected by the DLL 12 is input into the duty cycle corrector 11 to correct the duty ratio.

However, the phase of the clock output from the DLL 12 may be shifted when the duty ratio is changed by the duty cycle corrector 11. Therefore, even if the duty cycle corrector 11 and DLL 12 are exchanged, it is still difficult for the clock generator 10 not only to adjust the clock phase but also to correct the duty ratio.

It can also be thought to correct the duty ratios of the multi-phase clocks 12A output from the DLL 12.

If the duty ratios of the multi-phase clocks 12A output from the DLL 12 are corrected, however, the phases of the multi-phase clocks 12A may be shifted. To correct the duty ratios of the multi-phase clocks 12A, these duty ratios are expected to be individually corrected and a plurality of duty cycle correctors are thereby used. This is problematic in that the manufacturing cost of the clock generator 10 is increased.

As far as the general clock generator 10 described above, it is difficult not only to adjust the clock phase but also to correct the duty ratio.

Accordingly, the first embodiment and second embodiment described below provide a clock generator that addresses the above difficulty.

First Embodiment

Figure 4:
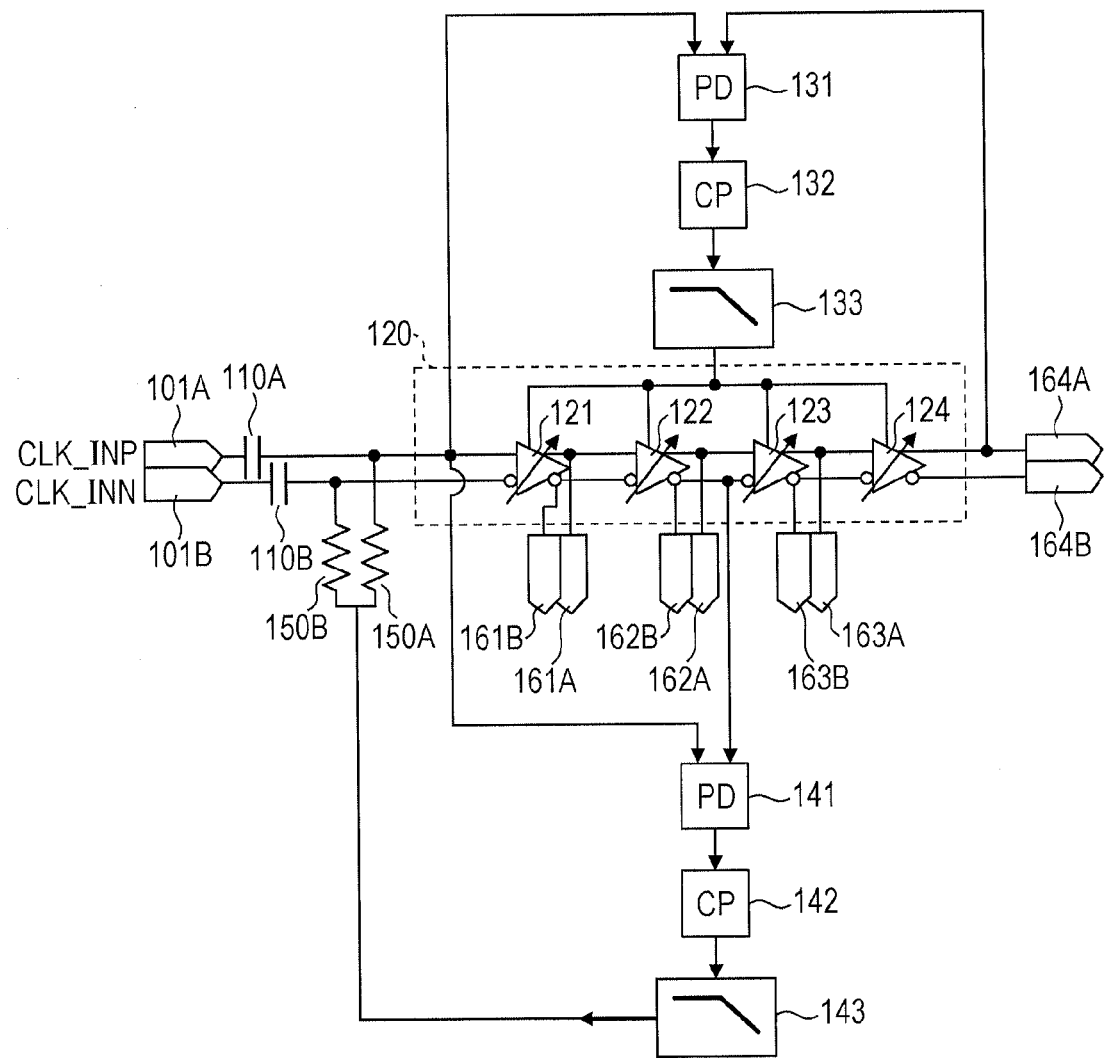
FIG. 4 illustrates a clock generator in a first embodiment.

FIG. 4 illustrates a clock generator 100 in the first embodiment

The clock generator 100 includes input terminals 101A and 101B, capacitors 110A and 110B, a delay circuit 120, a phase detector (PD) 131, a charge pump (CP) 132, a loop filter 133, a PD 141, a CP 142, a loop filter 143, resistors 150A and 150B, and output terminals 161A to 164A and 161B to 164B.

Of the constituent elements of the clock generator 100, the delay circuit 120, PD 131, CP 132, and loop filter 133 constitute a delay locked loop (DLL). The delay circuit 120, PD 141, CP 142, and loop filter 143 constitute a duty cycle corrector (DCC).

The input terminals 101A and 101B, which are input terminals of the clock generator 100, respectively receive clocks CLP_INP and CLK_INN, which are generated by, for example, a PLL and have prescribed frequencies. Since differential clocks CLP_INP and CLK_INN are input into the clock generator 100, the clock generator 100 has two input terminals, 101A and 101B.

The capacitor 110A is connected between the input terminal 101A and the delay circuit 120 in series. The capacitor 110B is connected between the input terminal 101B and the delay circuit 120 in series. The capacitor 110A is provided to remove a direct current component from the differential clock to be input into the input terminal 101A. The capacitor 110B is provided to remove a direct current component from the differential clock to be input into the input terminal 101B.

The delay circuit 120 is connected to the output terminals of the capacitors 110A and 110B (the terminals on the right side of the capacitors 110A and 110B in FIG. 4). The delay circuit 120 has delay elements 121, 122, 123, and 124. The delay elements 121 to 124 are examples of delay stages. Although an embodiment in which the delay circuit 120 has four delay stages will be described below, this is not a limitation; it suffices for the delay circuit 120 has an even number of delay stages (2N stages, N being an integer greater than or equal to 1). The delay elements 121 to 124 may be differential buffers or differential inverters.

In practice, the delay elements 121 to 124 each have one inverter that receives one of a pair of differential input clocks and one inverter that receives the other of the differential input clock pair. In FIG. 4, however, the delay elements 121 to 124 are each represented by one symbol.

The delay elements 121 to 124 each have a pair of input terminals (a pair of vertical terminals on the left side of the relevant delay element in FIG. 4) and a pair of output terminals (a pair of vertical terminals on the right side of the relevant delay element in FIG. 4). The delay elements 121 to 124 are connected in series in that order.

The delay elements 121 to 124 each receive one of the differential input clock pair at the upper input terminal, give a delay time to the differential input clock, invert the differential input clock, and output the inverted differential input clock from the upper output terminal. The delay elements 121 to 124 each receive the other of the differential input clock pair at the lower input terminal, give a delay time to the differential input clock, invert the differential input clock, and output the inverted differential input clock from the lower output terminal.

The delay times given to the input clock by the delay elements 121 to 124 have been set to the same length of time. The total of the delay times given by the four delay elements 121 to 124 has been set so as to be equal to the time of one cycle of a clock to be input to the delay elements 121 to 124.

Accordingly, the delay time given by each of the delay elements 121 to 124 is one-fourth the time of one cycle of the clock to be input to the delay elements 121 to 124.

The delay elements 121 to 124 each has a phase control terminal connected to the output terminal of the loop filter 133. The delay time to be given to the input clock by the delay elements 121 to 124 is set according to the value of a voltage to be input from the loop filter 133 to the phase control terminals.

The delay time given to the input clock by the delay elements 121 to 124 is prolonged as the value of the voltage to be input from the loop filter 133 to the phase control terminals is increased. Conversely, the delay time is shortened as the as the value of the voltage to be input from the loop filter 133 to the phase control terminals is decreased.

One of the output terminal pair of the delay element 121 is connected to the output terminal 161A of the clock generator 100, and the other is connected to the output terminal 161B. One of the output terminal pair of the delay element 122 is connected to the output terminal 162A of the clock generator 100, and the other is connected to the output terminal 162B. One of the output terminal pair of the delay element 123 is connected to the output terminal 163A of the clock generator 100, and the other is connected to the output terminal 163B. One of the output terminal pair of the delay element 124 is connected to the output terminal 164A of the clock generator 100, and the other is connected to the output terminal 164B.

One of a pair of input terminals of the PD 131 is connected to one input terminal of the delay element 121 (the upper input terminal of the delay element 121 in FIG. 4) and the other of the input terminal pair is connected to one output terminal of the delay elements 124 (the upper output terminal of the delay element 124 in FIG. 4). The PD 131 detects the phases of clocks input to the input terminal pair and outputs, to the CP 132, a signal that represents a difference in the detected phases. The PD 131 is an example of a first phase detector.

The CP 132 outputs a current according to the value of the voltage of the signal that represents the difference in phases output from the PD 131. The CP 132 is an example of a first charge pump.

The loop filter 133 integrates a current output from the CP 132 and outputs a voltage that represents the resulting integrated value. The loop filter 133 is a low-pass filter (LPF) having a prescribed bandwidth. The loop filter 133 is an example of a first loop filter.

In the first embodiment, as an example, the bandwidth of the loop filter 133 differs from the bandwidth of the loop filter 143. The cut-off frequency of the loop filter 133 is set so as to be higher than the cut-off frequency of the loop filter 143.

The output terminal of the loop filter 133 is connected to the phase control terminals of the delay elements 121 to 124. The voltage output from the loop filter 133 is input into the phase control terminals of the delay elements 121 to 124. As a result, the total delay time given by the delay elements 121 to 124 is set to the time of one cycle of a clock to be input to the delay elements 121 to 124.

One of a pair of input terminals of the PD 141 is connected to one input terminal of the delay element 121 (the upper input terminal of the delay element 121 in FIG. 4) and the other of the input terminal pair is connected to one output terminal of the delay element 122 (the lower output terminal of the delay element 122 in FIG. 4). The delay element 122 is an example of the second stage of the four stages of the delay circuit 120. That is, when the integer N is 2, the delay element 122 is the Nth delay stage of the 2N delay stages.

The PD 141 detects the phases of clocks input into its input terminal pair and outputs, to the CP 142, a signal that represents a difference between the phases. The PD 141 is an example of a second phase detector.

The CP 142 outputs a current according to the value of the voltage of the signal that represents the difference in phases output from the PD 141. The CP 142 is an example of a second charge pump.

The loop filter 143 integrates a current output from the CP 142 and outputs a voltage that represents the resulting integrated value. The loop filter 143 is a low-pass filter (LPF) having a prescribed bandwidth. The loop filter 143 is an example of a second loop filter.

In the first embodiment, as an example, the bandwidth of the loop filter 143 differs from the bandwidth of the loop filter 133. The cut-off frequency of the loop filter 143 is set so as to be lower than the cut-off frequency of the loop filter 133.

The output terminal of the loop filter 143 is connected to one ends of the resistors 150A and 150B (the lower terminals of the resistors 150A and 150B in FIG. 4).

A voltage output from the loop filter 143 is input through the resistors 150A and 150B to the delay circuit 120. The voltage then becomes a direct current component of a differential clock to be input into the delay circuit 120.

The one ends of the resistors 150A and 150B (the lower terminals of the resistors 150A and 150B in FIG. 4) are both connected to the output terminal of the loop filter 143. The other ends of the resistors 150A and 150B (the upper terminals of the resistors 150A and 150B in FIG. 4) are connected to a pair of input terminals of the delay circuit 120. Specifically, the other end of the resistor 150A is connected to one input terminal of the delay element 121 in the delay circuit 120 (the upper input terminal of the delay element 121 in FIG. 4), and the other end of the resistor 150B is connected to the other input terminal of the delay element 121 in the delay circuit 120 (the lower input terminal of the delay element 121 in FIG. 4).

The voltage output from the loop filter 143 is input through the resistors 150A and 150B to the input terminal pair of the delay element 121 in the delay circuit 120. Specifically, the output voltage from the loop filter 143 is superimposed through the resistors 150A and 150B to clocks to be input from the input terminals 101A and 101B of the clock generator 100 to the input terminal pair of the delay element 121.

The output terminals 161A and 161B are connected to the output terminal pair of the delay element 121. Similarly, the output terminals 162A and 162B are connected to the output terminal pair of the delay element 122, the output terminals 163A and 163B are connected to the output terminal pair of the delay element 123, and the output terminals 164A and 164B are connected to the output terminal pair of the delay element 124.

The delay elements 121 to 124 each have a delay time equal to one-fourth the time of one cycle of the input clock.

Accordingly, clocks output from the output terminals 161A, 162A, 163A, and 164A are multi-phase clocks the phases of which are shifted by one-fourth one cycle of the clock from the preceding clock.

The output terminal 161B outputs a clock the phase of which is shifted by 180 degrees (π) from the phase of the clock output from the output terminal 161A. Similarly, the output terminals 162B, 163B, and 164B each output a clock the phase of which is shifted by 180 degrees (π) from the phase of the clock output from the output terminals 162A, 163A, and 164A, respectively.

That is, differential multi-phase clocks with four phases are output from the output terminals 161A to 164A and output terminals 161B to 164B.

Next, clocks to be input into the input terminals of the PDs 131 and 141 will be described with reference to FIGS. 5A and 5B.

By the way, the PD 131, the CP 132 and the loop filter 133 may process a digital signal, in this case, the output signal of the loop filter 133 is converted to an analog signal. And the PD 141, the CP 142 and the loop filter 143 may process a digital signal, in this case, the output signal of the loop filter 143 is converted to an analog signal.

Figure 5A:
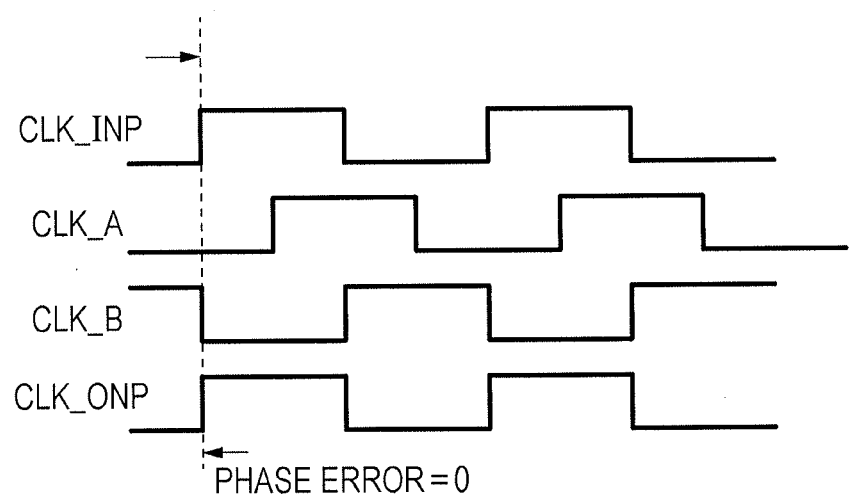
FIGS. 5A and 5B illustrate clocks related to phase detectors in the first embodiment.
Figure 5B:
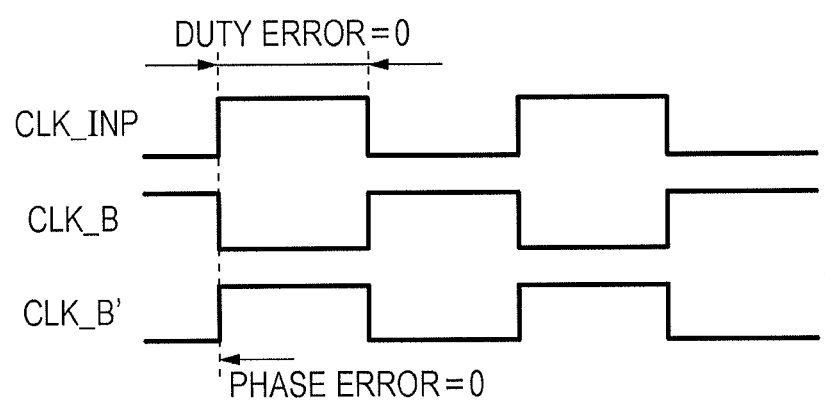

FIGS. 5A and 5B illustrate clocks related to the PDs 131 and 141. The clocks in FIGS. 5A and 5B are ideal clocks free from phase error. FIG. 5A illustrates a clock CLK_INP to be input into the PD 131 and a clock CLK_A output from one output terminal of the delay element 121 (the upper output terminal of the delay element 121 in FIG. 4). FIG. 5A also illustrates a clock CLK_B output from one output terminal of the delay element 122 (the upper output terminal of the delay element 122 in FIG. 4) and a clock CLK_ONP output from one output terminal of the delay element 124 (the upper output terminal of the delay element 124 in FIG. 4).

The clock CLK_INP to be input into the PD 131 is the same as the clock to be input into one input terminal of the delay element 121 (the upper input terminal of the delay element 121 in FIG. 4).

As illustrated in FIG. 5A, in a state in which the clocks have no phase error, there is no phase error between the clock CLK_INP to be input the PD 131 and the clock CLK_ONP output from one output terminal of the delay element 124 (the upper output terminal of the delay element 124 in FIG. 4).

This is because the phase difference between the clock to be input into one input terminal of the delay element 121 (the upper input terminal of the delay element 121 in FIG. 4) and the clock CLK_ONP output from one output terminal of the delay element 124 (the upper output terminal of the delay element 124 in FIG. 4) is equal to the length of the time of one cycle of the input clock.

The clock CLK_A output from one output terminal of the delay element 121 (the upper output terminal of the delay element 121 in FIG. 4) has a phase delayed by 90 degrees (π) with respect to the clock CLK_INP. The clock CLK_B output from one output terminal of the delay element 122 (the upper output terminal of the delay element 122 in FIG. 4) has a phase delayed by 90 degrees (π/2) with respect to the clock CLK_A.

FIG. 5B illustrates the clock CLK_INP to be input into the PD 141, the clock CLK_B output from one output terminal of the delay element 122 (the upper output terminal of the delay element 122 in FIG. 4), and a clock CLK_B' having a phase opposite to the phase of the clock CLK_B. The opposite phase is a phase in which the high level (1) and low level (0) of the clock are reversed; the leading edge and falling edge of the clock are reversed.

The clock CLK_INP to be input into the PD 141 is the same as the clock to be input into one input terminal of the delay element 121 (the upper input terminal of the delay element 121 in FIG. 4).

The phase of the clock CLK_B is delayed by 180 degrees (π) with respect to the clock CLK_INP, so if each clock is an ideal clock free from phase error, the clock CLK_B', which has a phase opposite to the phase of the clock CLK_B, and the clock CLK_INP have the same phase, phase error between them being 0.

In the clock generator 100 in the first embodiment, the duty ratio of the clock is set to 50%.

The phases of the clock CLK_INP and the clock CLK_B differ by 180 degrees (π). The clock CLK_B' has a phase opposite to the phase of the clock CLK_B.

Accordingly, when the PD 141 detects a phase difference between the clock LCK_INP and the clock CLK_B', it becomes possible to detect duty error of the clock CLK_INP.

This is because the clock CLK_B' has a phase, delayed by 180 degrees (π) with respect to the phase of the clock CLK_INP, that is opposite to the phase of the clock CLK_B, so if the clock CLK_INP has duty error, a phase difference between the clock CLK_INP and the clock CLK_B' appears as duty error.

When the duty error between the clock CLK_INP and the clock CLK_B' is corrected so that the duty error becomes 0, it becomes possible to set the duty ratio of the clock output from the delay circuit 120 to 50%.

Since the clock CLK_INP illustrated in FIG. 5B is an ideal clock free from duty error, its duty error is 0.

Next, a case in which the clock CLK_INP has duty error will be described with reference to FIGS. 6A and 6B.

Figure 6A:
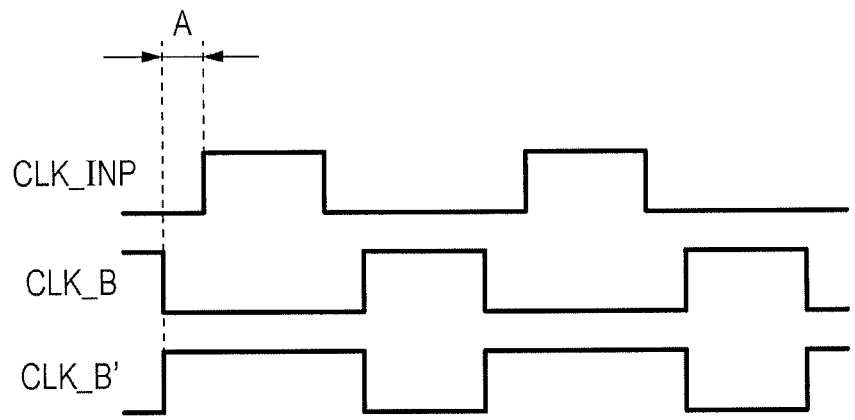
FIGS. 6A and 6B illustrate clocks related to the phase detector to which the clocks in FIG. 5B are related.
Figure 6B:
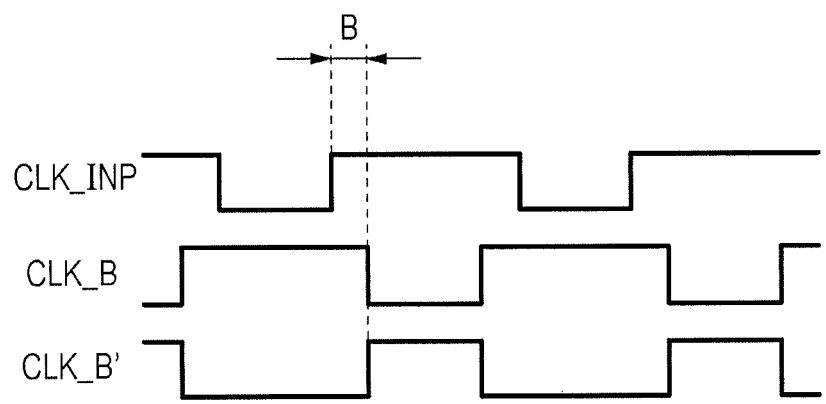

FIGS. 6A and 6B illustrate clocks related to the PD 141. Specifically, FIGS. 6A and 6B illustrate the clock CLK_INP to be input into the PD 141, the clock CLK_B output from one output terminal of the delay element 122 (the upper output terminal of the delay element 122 in FIG. 4), and the clock CLK_B' having a phase opposite to the phase of the clock CLK_B.

FIG. 6A illustrates waveforms that have a duty ratio of less than 50%, and FIG. 6B illustrates waveforms that have a duty ratio of more than 50%.

When, as illustrated in FIG. 6A, the duty ratio of the clock CLK_INP is less than 50%, error indicated by the arrow A, which is between a rising edge of the clock CLK_INP and a rising edge of the clock CLK_B' behind the rising edge of the clock CLK_INP, is duty error.

This duty error is caused because the clock CLK_B' has a phase that is opposite to the phase of the clock CLK_B, that is, is delayed by 180 degrees (π) with respect to the phase of the clock CLK_INP.

When, as illustrated in FIG. 6B, the duty ratio of the clock CLK_INP is more than 50%, error indicated by the arrow B, which is between a rising edge of the clock CLK_INP and a rising edge of the clock CLK_B' ahead of the rising edge of the clock CLK_INP, is duty error.

Accordingly, when the rising edge of the clock CLK_INP is behind the rising edge of the clock CLK_B', the duty ratio of the clock CLK_INP is less than 50%, in which case duty error is as indicated by the arrow A in FIG. 6A.

When the rising edge of the clock CLK_INP is ahead of the rising edge of the clock CLK_B', the duty ratio of the clock CLK_INP is more than 50%, in which case duty error is as indicated by the arrow B in FIG. 6B.

Next, methods of correcting the duty ratio will be described with reference to FIGS. 7A to 7D.

Figure 7A:
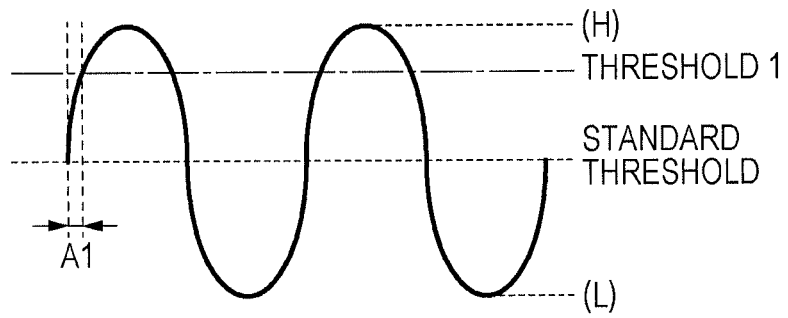
FIGS. 7A to 7D illustrate methods of correcting a duty ratio.
Figure 7B:
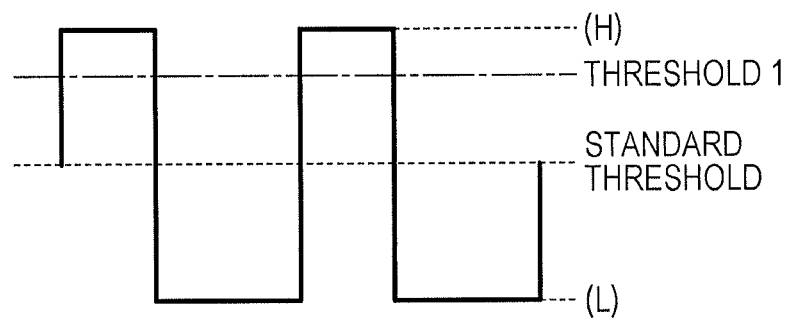
Figure 7C:
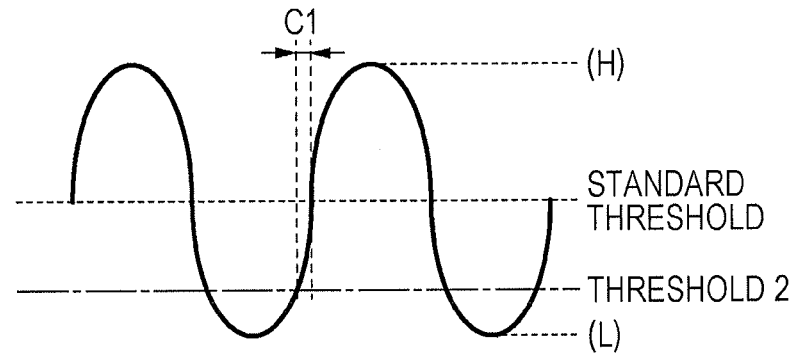
Figure 7D:
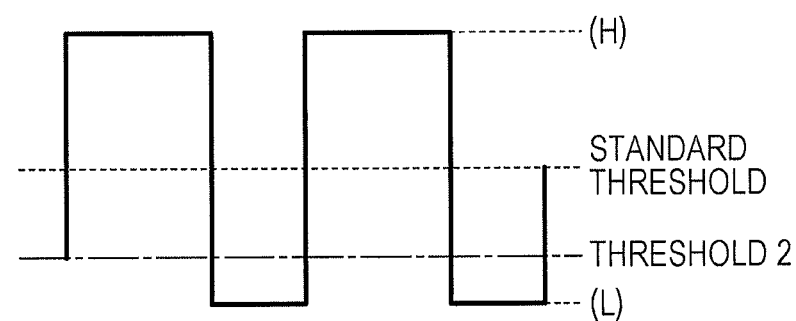

FIGS. 7A to 7D illustrate methods of correcting the duty ratio. FIGS. 7A and 7B are concerned with a method of reducing the duty ratio. FIGS. 7C and 7D are concerned with a method of increasing the duty ratio.

If the input signal is a sine wave as illustrated in FIG. 7A, a clock with a duty ratio of 50% is obtained by using a standard threshold indicated by the dashed line. The standard threshold indicated by the dashed line in FIG. 7A is used to generate a clock with a duty ratio of 50% from the input signal having a sine waveform, which is indicated by the solid line; the height of the threshold is at the center of the amplitude of the input signal having a sine waveform.

If a portion in which the signal level of the input signal having a sine waveform is higher than the standard threshold is defined as a high-level zone of the clock and a portion in which the signal level of the input signal having a sine waveform is lower than the standard threshold is defined as a low-level zone of the clock, then a pulse clock with a duty ratio of 50% may be obtained from the input signal with a sine waveform illustrated in FIG. 7A.

To reduce the duty ratio of the clock obtained from the input signal having a sine waveform illustrated in FIG. 7A, it suffices to use a threshold that is higher than the standard threshold indicated by the dashed line. When a threshold 1 indicated by the dash-dot line in FIG. 7A is used, it becomes possible to generate a clock, as indicated by the solid line in FIG. 7B, in which the high-level zone occupies a less portion than the low-level zone.

To increase the duty ratio of the clock obtained from the input signal having a sine waveform illustrated in FIG. 7C, it suffices to use a threshold that is lower than the standard threshold indicated by the dashed line. When a threshold 2 indicated by the dash-dot line in FIG. 7C is used, it becomes possible to generate a clock, as indicated by the solid line in FIG. 7D, in which the high-level zone occupies a more portion than the low-level zone.

When the standard threshold is changed as described above, in FIG. 7A, the position at which the input signal with a sine waveform crosses the standard threshold changes to the position at which the input signal crosses the threshold 1 by an amount indicated by the arrow A1. Similarly, in FIG. 7C, the position at which the input signal crosses the standard threshold changes to the position at which the input signal crosses the threshold 2 by an amount indicated by the arrow C1.

As described above, when the duty ratio is changed, the phase of the clock also changes. With the clock generator 100 in the first embodiment, however, the phase is adjusted by the DLL, which is formed with the delay circuit 120, PD 131, CP 132, and loop filter 133, so the problem with a change in the clock phase, which is caused when the duty ratio is corrected, is solved.

The relationships between the standard threshold, threshold 1, and threshold 2 illustrated in FIGS. 7A to 7D and the signal level direction (vertical direction in FIGS. 7A to 7D) are relative.

Accordingly, even if the input signal level is changed instead of changing the threshold level, it is possible to change the duty ratio as in the cases illustrated in FIGS. 7A to 7D.

With the clock generator 100 in the first embodiment, the CP 142 converts duty error detected by the PD 141 to a current and the loop filter 143 integrates the current. That is, the voltage value output from the loop filter 143 is based on the duty error detected by the PD 141.

The voltage value output from the loop filter 143 is superimposed through the resistors 150A and 150B to a clock to be input to the delay circuit 120.

Thus, the direct current component of the clock to be input to the delay circuit 120 is known, providing an effect similar to the changing of the signal level of the input signal illustrated in FIGS. 7A and 7C.

The clock generator 100 in the first embodiment uses the voltage value output from the loop filter 143 to correct the duty ratio of the clock.

Since the voltage value output from the loop filter 143 is based on the duty error detected by the PD 141, if the voltage value output from the loop filter 143 is superimposed through the resistors 150A and 150B to a clock to be input to the delay circuit 120, it is possible to correct the duty ratios of the multi-phase clocks output from the delay circuit 120.

As described above, the clock generator 100 in the first embodiment enables not only clock phase adjustment by the DLL, which is formed with the delay circuit 120, PD 131, CP 132, and loop filter 133, but also duty ratio correction by the DCC, which is formed with the delay circuit 120, PD 141, CP 142, and loop filter 143.

Accordingly, the clock generator 100 is operable to output, from the output terminals 161A to 164A and 161B to 164B, multi-phase clocks in which phase shifts and duty ratio changes are suppressed by performing not only phase adjustment but also duty ratio correction.

The clock generator 100 in the first embodiment also uses the PD 141 to detect a phase difference between the clock to be input into one input terminal of the delay element 121 at the first stage (the upper input terminal of the delay element 121 in FIG. 4) and the clock output from one output terminal of the delay element 122 at the second stage from the input side (the lower output terminal of the delay element 122 in FIG. 4).

The clock output from the one output terminal of the delay element 122 (the lower output terminal of the delay element 122 in FIG. 4) has a phase that is opposite to the phase of the clock to be input into the one input terminal of the delay element 121 at the first stage (the upper input terminal of the delay element 121 in FIG. 4), that is, is delayed by 180 degrees with respect to the phase.

The PD 141 detects a phase difference when the duty ratio of the clock output from the delay circuit 120 has been changed from 50%.

Accordingly, when the PD 141 handles the phase difference as duty error and corrects the duty ratio, it becomes possible to correct the duty ratios of the multi-phase clocks output from the output terminals 161A to 164A and 161B to 164B so that the duty ratios become 50%.

In the clock generator 100 in the first embodiment, there is a difference in bandwidth between the loop filter 133 included in the DLL and the loop filter 143 included in the DCC.

Accordingly, the DLL and DCC have different response characteristics, enabling interference between the DLL and the DCC to be suppressed.

To suppress this interference, in the clock generator 100 in the first embodiment, the cut-off frequency of the loop filter 133 included in the DLL is made higher than the cut-off frequency of the loop filter 143 included in the DCC. In other words, the cut-off frequency of the loop filter 143 is made lower than the cut-off frequency of the loop filter 133.

This is achieved by increasing the capacitance of the capacitor included in the loop filter 143 or increasing the resistor resistance.

Therefore, the loop response characteristics of the DLL including the loop filter 133 become faster than the loop response characteristics of the DCC including the loop filter 143.

Accordingly, it is possible to provide the clock generator 100 that not only suppresses interference between the DLL and the DCC but also prioritizes clock phase adjustment by the DLL over duty ratio correction by the DCC.

So far, an embodiment has been described in which the cut-off frequency of the loop filter 143 is made lower than the cut-off frequency of the loop filter 133 to make the loop response characteristics of the DLL faster than the loop response characteristics of the DCC.

However, the value of the output current from the CP 142 may be made lower than the value of the output current from the CP 132 instead of making the cut-off frequency of the loop filter 143 lower than the cut-off frequency of the loop filter 133. When the value of the output current from the CP 142 is made lower than the value of the output current from the CP 132, it becomes possible to make the loop response characteristics of the DLL faster than the loop response characteristics of the DCC.

To make the value of the output current from the CP 142 lower than the value of the output current from the CP 132, it suffices to, for example, make the size of a transistor included in the CP 142 smaller than the size of a transistor included in the CP 132.

In addition to making the cut-off frequency of the loop filter 143 lower than the cut-off frequency of the loop filter 133, the value of the output current from the CP 142 may be made lower than the value of the output current from the CP 132.

Alternatively, the cut-off frequency of the loop filter 133 included in the DLL may be made lower than the cut-off frequency of the loop filter 143 included in the DCC. There may be a case in which duty ratio correction by the DCC is preferably prioritized over clock phase adjustment by the DLL depending on the application. Then, it suffices to make the cut-off frequency of the loop filter 133 included in the DLL lower than the cut-off frequency of the loop filter 143 included in the DCC.

To have the DLL and DCC exhibit different response characteristics, the value of the output current from the CP 142 may be made lower than the value of the output current from the CP 132 instead of making the value of the output current from the CP 132 lower than the value of the output current from the CP 142.

When no interference occurs between the DLL and the DCC or interference therebetween is not problematic, the loop filter 133 and loop filter 143 may have the same cut-off frequency and the CP 132 and CP 142 may output current of the same value.

So far, an embodiment has been described for a case in which integer N is 2, the delay circuit 120 includes 2N (four) delay stages (delay elements 121 to 124), and an input into the delay element 121 at the first stage and an output from the inverter at the second stage are used to correct the duty ration.

However, the number of inverters is not limited to four. If a delay circuit having 2N inverters (N being an integer greater than or equal to 1) is used in which a delay time from the first stage to the last stage is N cycles of a clock, the duty ratio may be corrected to 50% by using outputs from the inverters at the first stage and Nth stage.

Alternatively, if, for example, a delay circuit having 4N inverters (N being an integer greater than or equal to 1) is used in which a delay time from the first stage to the last stage is 2N cycles of a clock, the duty ratio may be corrected to 50% by using an output from the inverter at the Nth stage or 3Nth stage. When, for example, the integer N is 1 and the delay circuit includes four inverters that has a delay time equal to two cycles of a clock from the first stage to the last stage, the duty ratio may be corrected to 50% by using an output from the inverter at the first stage or third stage.

Second Embodiment

Figure 8:
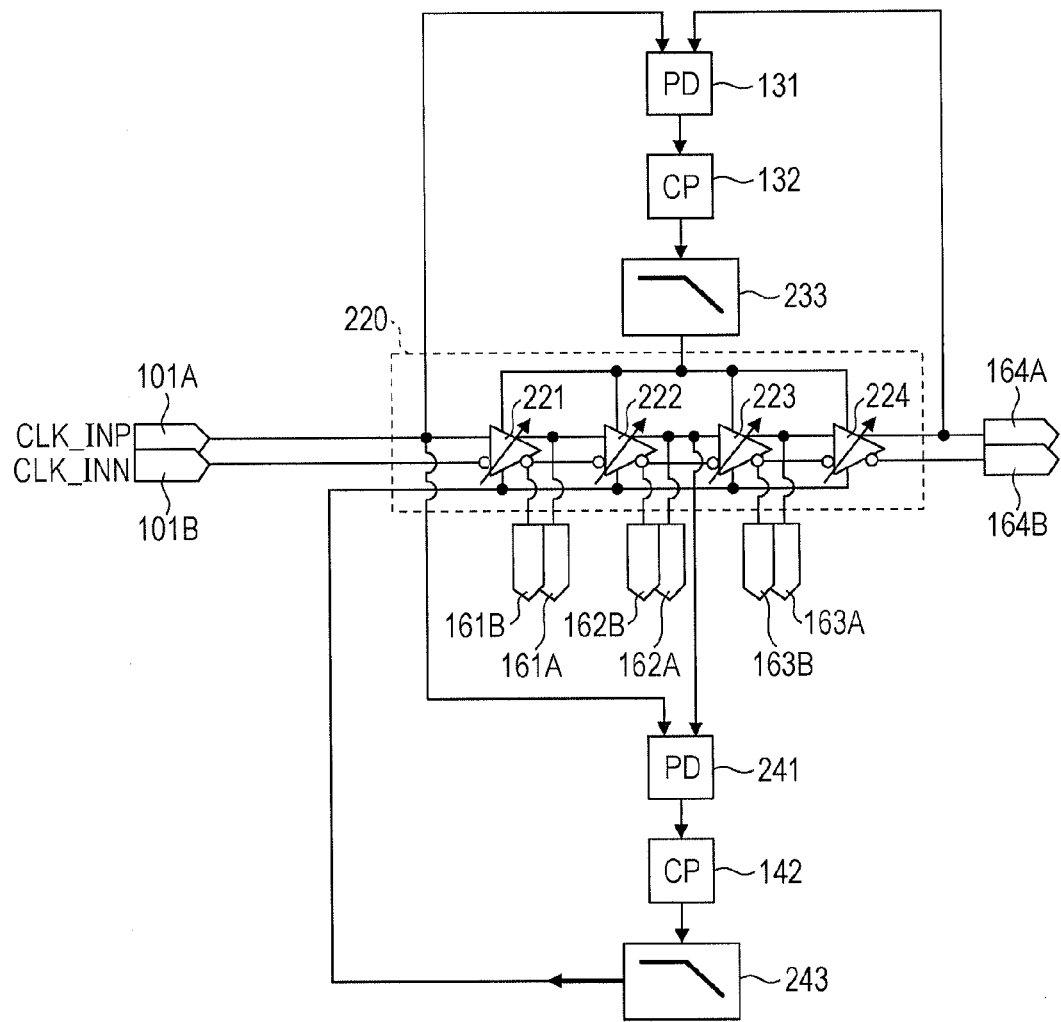
FIG. 8 illustrates a clock generator in a second embodiment.

FIG. 8 illustrates a clock generator 200 in a second embodiment.

The clock generator 200 in the second embodiment differs from the clock generator 100 in the first embodiment in that the slew rates of clocks detected by the PD 131 and PD 241 are made to differ instead of making the cut-off frequency of the loop filter 143 lower than the cut-off frequency of the loop filter 133.

The other structure of the clock generator 200 in the second embodiment is the same as in the clock generator 100 in the first embodiment, so the same elements as elements in the clock generator 100 in the first embodiment will be denoted by the same reference numerals and repeated descriptions will be omitted.

The clock generator 200 includes input terminals 101A and 1016, a delay circuit 220, a PD 131, a CP 132, a loop filter 233, a PD 241, a CP 142, a loop filter 243, and output terminals 161A to 164A and 161B to 164B.

Unlike the clock generator 100 (see FIG. 4) in the first embodiment, the clock generator 200 does not include the capacitors 110A and 1106 or the resistors 150A and 150B.

The delay circuit 220 has delay elements 221, 222, 223, and 224. As with the delay elements 121 to 124 in the delay circuit 120 (see FIG. 4) in the first embodiment, the delay elements 221 to 224 are mutually connected in series.

The delay elements 221 to 224 each have a pair of input terminals (a pair of vertical terminals on the left side of the relevant delay element in FIG. 8) and a pair of output terminals (a pair of vertical terminals on the right side of the relevant delay element in FIG. 8). The delay elements 221 to 224 are connected in series in that order.

The delay elements 221 to 224 each receive one of a pair of differential input clocks at the upper input terminal, gives a delay time to the differential input clock, inverts the differential input clock, and outputs the inverted differential input clock from the upper output terminal. The delay elements 221 to 224 each receives the other of the differential input clock pair at the lower input terminal, gives a delay time to the differential input clock, inverts the differential input clock, and outputs the inverted differential input clock from the lower output terminal.

The delay times given to the input clock by the delay elements 221 to 224 have been set to the same length of time. The total of the delay times given by the four delay elements 221 to 224 has been set so as to be equal to the time of one cycle of a clock to be input to the delay elements 221 to 224.

Accordingly, the delay time given by each of the delay elements 221 to 224 is one-fourth the time of one cycle of the clock to be input to the delay elements 221 to 224.

The delay elements 221 to 224 each have two control terminals, a phase control terminal and a duty control terminal. The phase control terminal of each delay element, which is one of the control terminals (the upper control terminal of the delay element in FIG. 8) is connected to the output terminal of the loop filter 233. The delay time to be given to the input clock by the delay elements 221 to 224 is set according to the value of a voltage to be input from the loop filter 233 to the phase control terminals.

The delay time given to the input clock by the delay elements 221 to 224 is shortened as the value of the voltage to be input from the loop filter 233 to the phase control terminals is increased. Conversely, the delay time is prolonged as the as the value of the voltage to be input from the loop filter 233 to the phase control terminals is decreased.

The duty control terminal of each of the delay elements 221 to 224, which is the other of the control terminals (the lower control terminal of the delay element in FIG. 8) is connected to the output terminal of the loop filter 243. As with the loop filter 143 (see FIG. 4) in the first embodiment, the loop filter 243 outputs a voltage value based on duty error. The loop filter 243 inputs a voltage value based on duty error to the duty control terminals to set the slew rates of the rising edges and falling edges of clocks output from the delay elements 221 to 224 in the delay circuit 220.

One of the output terminal pair of the delay element 221 is connected to the output terminal 161A of the clock generator 200, and the other is connected to the output terminal 161B. One of the output terminal pair of the delay element 222 is connected to the output terminal 162A of the clock generator 100, and the other is connected to the output terminal 162B. One of the output terminal pair of the delay element 223 is connected to the output terminal 163A of the clock generator 100, and the other is connected to the output terminal 163B. One of the output terminal pair of the delay element 224 is connected to the output terminal 164A of the clock generator 100, and the other is connected to the output terminal 164B.

As with the loop filter 133 in the first embodiment, the loop filter 233 integrates a current output from the CP 132. However, the cut-off frequency of the loop filter 233 is set to a frequency equal to the cut-off frequency of the loop filter 243.

One of a pair of input terminals of the PD 241 (the input terminal on the right side of the PD 241 in FIG. 8) is connected to a terminal different from the relevant terminal connected to the PD 141 (see FIG. 4) in the first embodiment.

The two input terminals of the PD 241 are connected to one input terminal of the delay element 221 (the upper input terminal of the delay element 221 in FIG. 8) and to the other of the input terminal pair is connected to one output terminal of the delay elements 222 (the upper output terminal of the delay element 222 in FIG. 8). The PD 241 detects a phase difference between a rising edge of the clock to be input into one input terminal of the delay element 221 (the upper input terminal of the delay element 221 in FIG. 8) and the relevant falling edge of the clock output from one output terminal of the delay element 222 (the upper output terminal of the delay element 222 in FIG. 8). The PD 241 outputs a signal that represents the phase difference to the CP 142.

The falling edge of the clock output from the one input terminal of the delay element 222 (the upper output terminal of the delay element 222 in FIG. 8) has the same phase as the rising edge of the clock output from the other output terminal of the delay element 222 (the lower output terminal of the delay element 222 in FIG. 8). This is because these clocks have mutually opposite phases.

As with the PD 141 in the first embodiment, therefore, it is possible for the PD 241 to detect phase error by detecting a phase difference between a rising edge of the clock to be input into the one input terminal of the delay element 221 (the upper input terminal of the delay element 221 in FIG. 8) and the relevant falling edge of the clock output from one output terminal of the delay element 222 (the upper output terminal of the delay element 222 in FIG. 8).

As with the loop filter 143 in the first embodiment, the loop filter 243 integrates a current output from the CP 142. However, the cut-off frequency of the loop filter 243 is set to a frequency equal to the cut-off frequency of the loop filter 233.

The operation of the PD 241 will be described below with reference to FIGS. 9A and 9B.

Figure 9A:
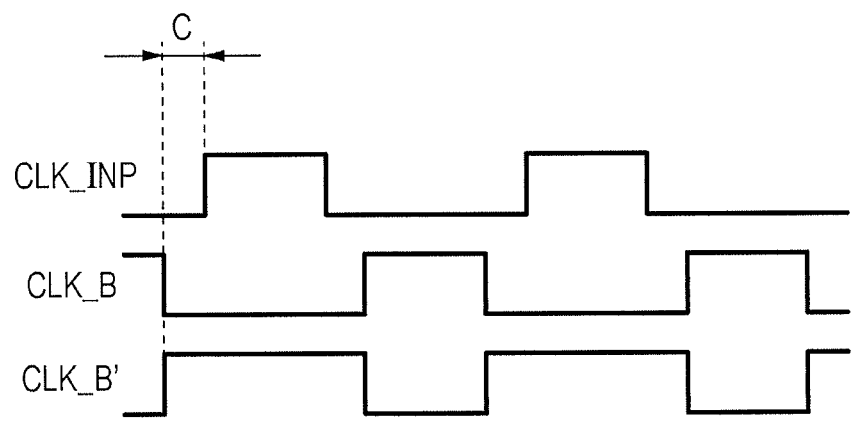
FIGS. 9A and 9B illustrate clocks related to a phase detector in the second embodiment.
Figure 9B:
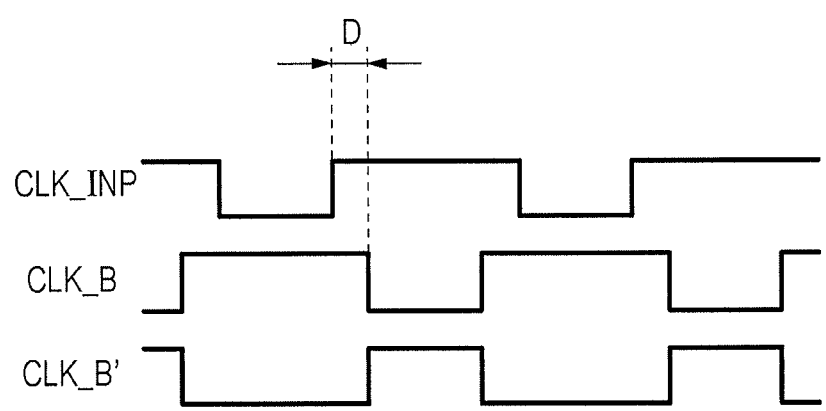

FIGS. 9A and 9B illustrate clocks related to the PD 241. FIGS. 9A and 9B each illustrate a clock CLK_INP to be input into one input terminal of the delay element 221 (the upper input terminal of the delay element 221 in FIG. 8), a clock CLK_B output from one output terminal of the delay element 222 (the upper output terminal of the delay element 222 in FIG. 8), and a clock CLK_B' having a phase opposite to the phase of the clock CLK_B.

The PD 241 detects a phase difference between a rising edge of the clock CLK_INP to be input into one input terminal of the delay element 221 (the upper input terminal of the delay element 221 in FIG. 8) and the relevant falling edge of the clock CLK_B output from one output terminal of the delay element 222 (the upper output terminal of the delay element 222 in FIG. 8). Thus, as with the PD 141 in the first embodiment, the PD 241 is operable to detect phase error.

When, as illustrated in FIG. 9A, the duty ratio of the clock CLK_INP is less than 50%, error indicated by the arrow C, which is between a rising edge of the clock CLK_INP and a falling edge of the clock CLK_B behind the rising edge of the clock CLK_INP, is duty error. The error indicated by the arrow C is equal to error between a rising edge of the clock CLK_INP and a rising edge of the clock CLK_B' behind the rising edge of the clock CLK_INP.

When, as illustrated in FIG. 9B, the duty ratio of the clock CLK_INP is more than 50%, error indicated by the arrow D, which is between a rising edge of the clock CLK_INP and a falling edge of the clock CLK_B ahead of the rising edge of the clock CLK_INP, is duty error. The error indicated by the arrow D is equal to error between a rising edge of the clock CLK_INP and a rising edge of the clock CLK_B' ahead of the rising edge of the clock CLK_INP.

Accordingly, the PD 241 is operable to detect phase error by detecting a phase difference between a rising edge of the clock CLK_INP to be input into one input terminal of the delay element 221 (the upper input terminal of the delay element 221 in FIG. 8) and the relevant falling edge of the clock CLK_B output from one output terminal of the delay element 222 (the upper output terminal of the delay element 222 in FIG. 8).

Next, the circuit structure of the delay element 221 will be described with reference to FIG. 10.

Figure 10:
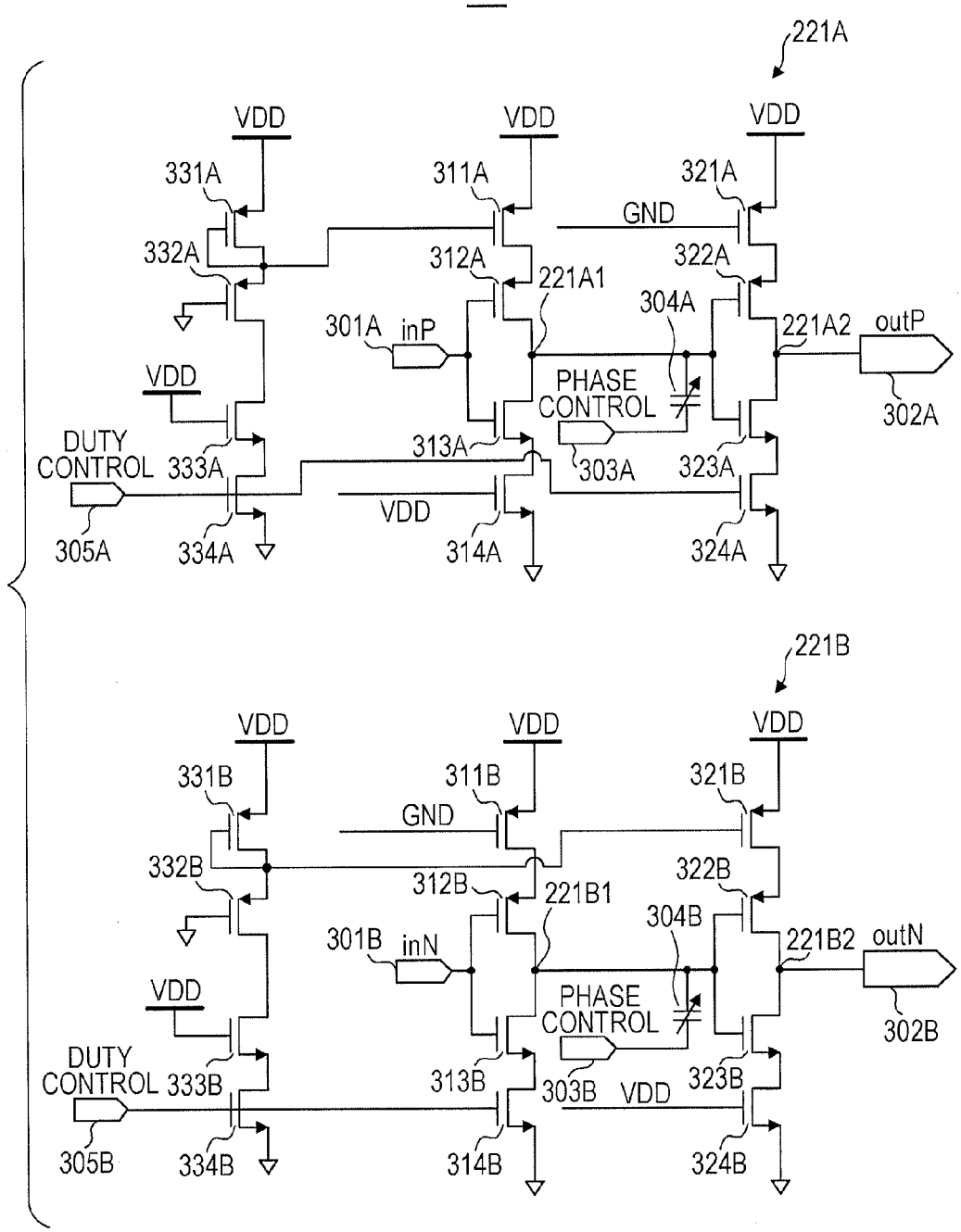
FIG. 10 illustrates the circuit structure of a delay element included in a delay circuit in the clock generator in the second embodiment.

FIG. 10 illustrates the circuit structure of the delay element 221 included in the delay circuit 220 in the clock generator 200 in the second embodiment. The delay elements 221 to 224 included in the delay circuit 220 have the same circuit structure, so the circuit structure of only the delay element 221 will be described below.

The delay element 221 includes input terminals 301A and 301B, output terminals 302A and 302B, phase control terminals 303A and 303B, varactors 304A and 304B, and duty control terminals 305A and 305B.

The delay element 221 further includes p-type metal oxide silicon (PMOS) transistors 311A, 311B, 312A, 312B, 321A, 321B, 322A, 322B, 331A, 331B, 332A, and 332B.

The delay element 221 further includes n-type metal oxide silicon (NMOS) transistors 313A, 313B, 314A, 314B, 323A, 323B, 324A, 324B, 333A, 333B, 334A, and 334B.

The input terminal 301A is connected to the gates of the PMOS transistor 312A and NMOS transistor 313A. The input terminal 301B is connected to the gates of the PMOS transistor 312B and NMOS transistor 313B.

The input side of the input terminal 301A, which is connected to the input terminal 101A of the clock generator 200, receives the differential clock CLP_INP. The input side of the input terminal 301B, which is connected to the input terminal 101B of the clock generator 200, receives the differential clock CLP_INN. That is, the input terminals 301A and 301B are equivalent to the input terminals of the delay circuit 220.

The output terminal 302A is connected to the output terminal of a complementary metal oxide semiconductor (CMOS) structured with the PMOS transistor 322A and NMOS transistor 323A.

The output terminal 302B is connected to the output terminal of a CMOS structured with the PMOS transistor 322B and NMOS transistor 323B.

The output sides of the output terminals 302A and 302B are connected to a pair of input terminals (similar to the input terminals 301A and 302B) of the delay element 222 (see FIG. 8) at a next stage. That is, clocks that have been given a delay time by the delay element 221 and the phases of which have been inverted by the delay element 221 are input through the output terminals 302A and 302B to the delay element 222 at the next stage.

The phase control terminals 303A and 303B are respectively connected to input terminals of the varactors 304A and 304B.

The input sides of the phase control terminals 303A and 303B are connected to the loop filter 233 (see FIG. 8). To adjust delay times to be given to the clocks by the delay element 221, the delay element 221 adjusts the variable capacities of the varactors 304A and 304B by using voltage values that are input from the loop filter 233 into the phase control terminals 303A and 303B.

The varactors 304A and 304B are variable-capacity elements that are able to change their capacities according to the input voltage. The input terminals of the varactors 304A and 304B are respectively connected to the phase control terminals 303A and 303B.

The output terminal of the varactor 304A is connected to the gates of the PMOS transistor 322A and the NMOS transistor 323A, which constitute a CMOS circuit. The output terminal of the varactor 304B is connected to the gates of the PMOS transistor 322B and NMOS transistor 323B, which constitute a CMOS circuit.

The duty control terminal 305A is connected to the gates of the NMOS transistor 334A and NMOS transistor 324A. The duty control terminal 305B is connected to the gates of the NMOS transistor 334B and NMOS transistor 324B.

The input side of the duty control terminal 305A is connected to the output terminal of the loop filter 243 (see FIG. 8). Therefore, the gate voltages of the NMOS transistors 334A, 324A, 334B, and 324B are controlled by the output voltage from the loop filter 243.

The PMOS transistor 311A, PMOS transistor 312A, NMOS transistor 313A, and NMOS transistor 314A are vertically stacked in that order, the PMOS transistor 311A being placed atop.

The source of the PMOS transistor 311A is connected to a power supply VDD. The drain of the PMOS transistor 311A is connected to the source of the PMOS transistor 312A. The gate of the PMOS transistor 311A is connected to the drain and gate of the PMOS transistor 331A and the source of the PMOS transistor 332A.

The source of the PMOS transistor 312A is connected to the drain of the PMOS transistor 311A. The drain of the PMOS transistor 312A is connected to the drain of the NMOS transistor 313A and the gates of the PMOS transistor 322A and NMOS transistor 323A.

The gate of the PMOS transistor 312A is connected to the input terminal 301A. The PMOS transistor 312A forms a CMOS circuit together with the NMOS transistor 313A.

The drain of the NMOS transistor 313A is connected to the drain of the PMOS transistor 312A and to the gates of the PMOS transistor 322A and NMOS transistor 323A. The source of the NMOS transistor 313A is connected to the drain of the NMOS transistor 314A. The gate of the NMOS transistor 313A is connected to the input terminal 301A. The NMOS transistor 313A forms a CMOS circuit together with the PMOS transistor 312A.

The drain of the NMOS transistor 314A is connected to the source of the NMOS transistor 313A. The source of the NMOS transistor 314A is grounded. The gate of the NMOS transistor 314A is connected to the power supply VDD. That is, the NMOS transistor 314A is left turned on.

The PMOS transistor 321A, PMOS transistor 322A, NMOS transistor 323A, and NMOS transistor 324A are vertically stacked in that order, the PMOS transistor 321A being placed atop.

The source of the PMOS transistor 321A is connected to the power supply VDD. The drain of the PMOS transistor 321A is connected to the source of the PMOS transistor 322A. The gate of the PMOS transistor 321A is grounded and is left at the ground (GND) level. Therefore, the PMOS transistor 312A is left turned on.

The source of the PMOS transistor 322A is connected to the drain of the PMOS transistor 321A. The drain of the PMOS transistor 322A is connected to the drain of the NMOS transistor 323A and the output terminal 302A.

The gate of the PMOS transistor 322A is connected to the gate of the NMOS transistor 323A, the output terminal of the varactor 304A, the drain of the PMOS transistor 312A, and the drain of the NMOS transistor 313A. The PMOS transistor 322A forms a CMOS circuit together with the NMOS transistor 323A.

The drain of the NMOS transistor 323A is connected to the drain of the PMOS transistor 322A and the output terminal 302A. The source of the NMOS transistor 323A is connected to the drain of the NMOS transistor 324A.

The gate of the NMOS transistor 323A is connected to the gate of the PMOS transistor 322A, the output terminal of the varactor 304A, the drain of the PMOS transistor 312A, and the drain of the NMOS transistor 313A.

The NMOS transistor 323A forms a CMOS circuit together with the PMOS transistor 322A. An output from the CMOS circuit formed with the PMOS transistor 322A and NMOS transistor 323A is supplied from the output terminal 302A.

The drain of the NMOS transistor 324A is connected to the source of the NMOS transistor 323A. The source of the NMOS transistor 324A is grounded. The gate of the NMOS transistor 324A is connected to the duty control terminal 305A. The NMOS transistor 324A is driven on a gate voltage that is input from the duty control terminal 305A into the gate.

The PMOS transistor 331A, PMOS transistor 332A, NMOS transistor 333A, and NMOS transistor 334A are vertically stacked in that order, the PMOS transistor 331A being placed atop.

The source of the PMOS transistor 331A is connected to the power supply VDD. The drain of the PMOS transistor 331A is connected to its gate and the source of the PMOS transistor 332A.

The source of the PMOS transistor 332A is connected to the drain and gate of the PMOS transistor 331A and to the gate of the PMOS transistor 311A. The drain of the PMOS transistor 332A is connected to the drain of the NMOS transistor 333A. The gate of the PMOS transistor 332A is grounded. Therefore, the PMOS transistor 332A is left turned on.

The drain of the NMOS transistor 333A is connected to the drain of the PMOS transistor 332A. The source of the NMOS transistor 333A is connected to the drain of the NMOS transistor 334A. The gate of the NMOS transistor 333A is connected to the power supply VDD. Therefore, the NMOS transistor 333A is left turned on.

The drain of the NMOS transistor 334A is connected to the source of the NMOS transistor 333A. The source of the NMOS transistor 334A is grounded. The gate of the NMOS transistor 334A is connected to the duty control terminal 305A. Accordingly, the NMOS transistor 334A is driven on a gate voltage that is input from the duty control terminal 305A into the gate.

As described above, the PMOS transistors 311A, 312A, 321A, 322A, 331A and 332A and the NMOS transistors 313A, 314A, 323A, 324A, 333A and 334A constitute the circuit indicated in the upper half in FIG. 10.

The circuit indicated in the upper half is a circuit, in the delay element 221 (see FIG. 8), that receives the clock CLK_INP. The circuit indicated in the upper half will be referred to below as the circuit 221A. The delay element 221 includes the circuit 221A indicated in the upper half in FIG. 10 and a circuit 221B indicated in the lower half in FIG. 10.

In the circuit 221A, a current mirror circuit is formed with a circuit formed by vertically stacking the PMOS transistor 331A, PMOS transistor 332A, NMOS transistor 333A, and NMOS transistor 334A in that order as well as a circuit formed by vertically stacking the PMOS transistor 311A, PMOS transistor 312A, NMOS transistor 313A, and NMOS transistor 314A in that order.

The current mirror circuit is formed because the gate of the PMOS transistor 331A, in which its gate and drain are mutually connected, is connected to the gate of the PMOS transistor 311A and the two circuits formed by vertical stacking are each connected between the power supply VDD and ground.

The operation of the circuit 221A in the delay element 221 will be described later with reference to FIG. 11.

The PMOS transistor 311B, PMOS transistor 312B, NMOS transistor 313B, and NMOS transistor 314B are vertically stacked in that order, the PMOS transistor 311B being placed atop.

The source of the PMOS transistor 311B is connected to the power supply VDD. The drain of the PMOS transistor 311B is connected to the source of the PMOS transistor 312B. The gate of the PMOS transistor 311B is grounded and is left at the ground (GND) level. Therefore, the PMOS transistor 311B is left turned on.

The source of the PMOS transistor 312B is connected to the drain of the PMOS transistor 311B, and the drain of the PMOS transistor 312B is connected to the drain of the NMOS transistor 313B and to the gates of the PMOS transistor 322B and NMOS transistor 323B. The gate of the PMOS transistor 312B is connected to the input terminal 301B. Accordingly, the PMOS transistor 312B is driven on a gate voltage that is input from the input terminal 301B into the gate. The PMOS transistor 312B forms a CMOS circuit together with the NMOS transistor 313B.

The drain of the NMOS transistor 313B is connected to the drain of the PMOS transistor 312B and to the gates of the PMOS transistor 322B and NMOS transistor 323B. The gate of the NMOS transistor 313B is connected to the input terminal 301B. Accordingly, the NMOS transistor 313B is driven on a gate voltage that is input from the input terminal 301B into the gate. The NMOS transistor 313B forms a CMOS circuit together with the PMOS transistor 312B.

The drain of the NMOS transistor 314B is connected to the source of the NMOS transistor 313B. The source of the NMOS transistor 314B is grounded. The gate of the NMOS transistor 314B is connected to the duty control terminal 305B. Accordingly, the NMOS transistor 314B is driven on a gate voltage that is input from the duty control terminal 305B into the gate.

The PMOS transistor 321B, PMOS transistor 322B, NMOS transistor 323B, and NMOS transistor 324B are vertically stacked in that order, the PMOS transistor 321B being placed atop.

The source of the PMOS transistor 321B is connected to the power supply VDD. The drain of the PMOS transistor 321B is connected to the source of the PMOS transistor 322B. The gate of the PMOS transistor 321B is connected to the drain and gate of the PMOS transistor 331B and to the source of the PMOS transistor 332B.

The source of the PMOS transistor 322B is connected to the drain of the PMOS transistor 321B. The drain of the PMOS transistor 322B is connected to the output terminal 302B. The gate of the PMOS transistor 322B is connected to the gate of the NMOS transistor 323B, the output terminal of the varactor 304B, the drain of the PMOS transistor 312B, and the drain of the NMOS transistor 313B.

The PMOS transistor 322B forms a CMOS circuit together with the NMOS transistor 323B. The CMOS circuit formed with the PMOS transistor 322B and NMOS transistor 323B is driven by an output from the CMOS circuit formed with the PMOS transistor 312B and NMOS transistor 313B.

The drain of the NMOS transistor 323B is connected to the output terminal 302B. The source of the NMOS transistor 323B is connected to the drain of the NMOS transistor 324B. The gate of the NMOS transistor 323B is connected to the gate of the PMOS transistor 322B, the output terminal of the varactor 304B, the drain of the PMOS transistor 312B, and the drain of the NMOS transistor 313B.

The NMOS transistor 323B forms a CMOS circuit together with the PMOS transistor 322B. The CMOS circuit formed with the NMOS transistor 323B and PMOS transistor 322B is driven by an output from the CMOS circuit formed with the PMOS transistor 312B and NMOS transistor 313B.

The drain of the NMOS transistor 324B is connected to the source of the NMOS transistor 323B. The source of the NMOS transistor 324B is grounded. The gate of the NMOS transistor 324B is connected to the power supply VDD. Therefore, the NMOS transistor 324B is left turned on.

The PMOS transistor 331B, PMOS transistor 332B, NMOS transistor 333B, and NMOS transistor 334B are vertically stacked in that order, the PMOS transistor 331B being placed atop.

The source of the PMOS transistor 331B is connected to the power supply VDD. The drain of the PMOS transistor 331B is connected to its gate, the source of the PMOS transistor 332B, and the gate of the PMOS transistor 321B. The gate of the PMOS transistor 331B is connected to its drain, the source of the PMOS transistor 332B, and the gate of the PMOS transistor 321B.

The source of the PMOS transistor 332B is connected to the drain and gate of the PMOS transistor 331B and to the gate of the PMOS transistor 321B. The drain of the PMOS transistor 332B is connected to the drain of the NMOS transistor 333B. The gate of the PMOS transistor 332B is grounded. Accordingly, the PMOS transistor 332B is left turned on.

The drain of the NMOS transistor 333B is connected to the drain of the PMOS transistor 332B. The source of the NMOS transistor 333B is connected to the drain of the NMOS transistor 334B. The gate of the NMOS transistor 333B is connected to the power supply VDD. Therefore, the NMOS transistor 333B is left turned on.

The drain of the NMOS transistor 334B is connected to the source of the NMOS transistor 333B. The source of the NMOS transistor 334B is grounded. The gate of the NMOS transistor 334B is connected to the duty control terminal 305B. Accordingly, the NMOS transistor 334B is driven on a gate voltage that is input from the duty control terminal 305B into the gate.

As described above, the PMOS transistors 311B, 312B, 321B, 322B, 331B and 332B and the NMOS transistors 313B, 314B, 323B, 324B, 333B and 334B constitute the circuit indicated in the lower half in FIG. 10.

The circuit indicated in the lower half is a circuit, in the delay element 221 (see FIG. 8), that receives the clock CLK_INN. The circuit indicated in the lower half in FIG. 10 will be referred to below as the circuit 221B. The delay element 221 includes the circuit 221A indicated in the upper half in FIG. 10 and the circuit 221B in the lower half in FIG. 10.

In the circuit 221B, a current mirror circuit is formed with a circuit formed by vertically stacking the PMOS transistor 331B, PMOS transistor 332B, NMOS transistor 333B, and NMOS transistor 334B in that order as well as a circuit formed by vertically stacking the PMOS transistor 321B, PMOS transistor 322B, NMOS transistor 323B, and NMOS transistor 324B in that order.

The current mirror circuit is formed because the gate of the PMOS transistor 331B, in which its gate and drain are mutually connected, is connected to the gate of the PMOS transistor 321B and the two circuits formed by vertical stacking are each connected between the power supply VDD and ground.

The operation of the circuit 221B in the delay element 221 will be described later with reference to FIG. 11.

Figure 11A:
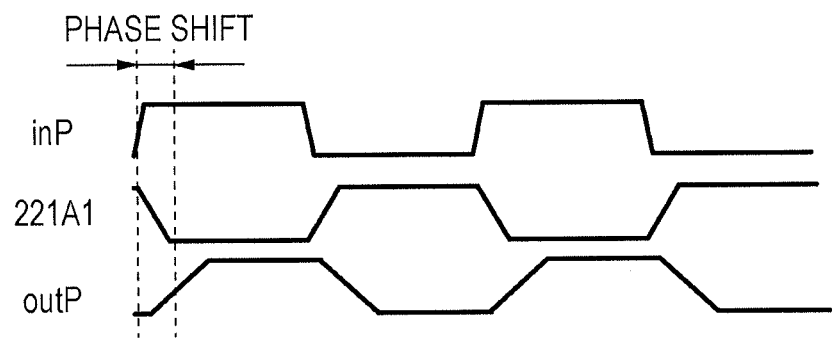
FIGS. 11A to 11C are timing diagrams illustrating the operations of the delay element.
Figure 11B:
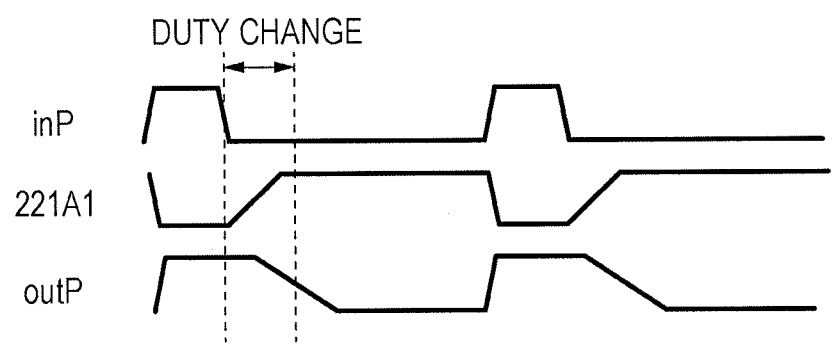
Figure 11C:
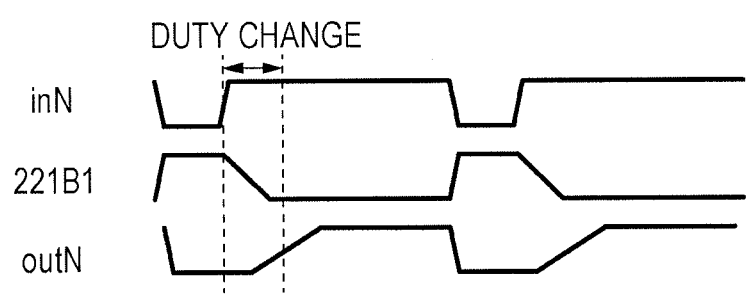

FIGS. 11A to 11C are timing diagrams illustrating the operations of the delay element 221. FIG. 11A illustrates waveforms obtained at nodes 221A1 and 221A2 when the clock CLK_INP is input into the circuit 221A.

The node 221A1 is an output node of the CMOS circuit formed with the PMOS transistor 312A and NMOS transistor 313A. The node 221A2 is an output node of the CMOS circuit formed with the PMOS transistor 322A and NMOS transistor 323A. In FIG. 11A, a clock to be input into the input terminal 301A is denoted inP, the waveform of a clock obtained at the node 221A1 is denoted 221A1, and the waveform of a clock obtained at the node 221A2 is denoted outP.

When a high-level clock CLK_INP is input into the input terminal 301A of the circuit 221A, the NMOS transistor 313A and PMOS transistor 322A are turned on.

It is assumed here that, for example, the PD 131 (see FIG. 8) has detected phase error and the capacity of the varactor 304A has been increased by the output voltage from the loop filter 233. A case in which the phase of the clock outP is delayed with respect to the clock inP will be described below as an example.

In this case, the form of each rising edge of the clock inP to be input into the input terminal 301A is made obtuse and the clock has a slow slew rate at the rising edge. Accordingly, the waveform obtained at the node 221A1 has a more obtuse rising edge than the form of the clock inP, and the waveform of the clock outP obtained at the node 221A2 has a further obtuse rising edge.

When a low-level clock CLK_INP is input into the input terminal 301A of the circuit 221A, the PMOS transistor 312A and NMOS transistor 323A are turned on.

It is assumed here that, for example, the PD 131 (see FIG. 8) has detected phase error and the capacity of the varactor 304A has been increased by the output voltage from the loop filter 233.

In this case, the form of each falling edge of the clock inP to be input into the input terminal 301A is made obtuse and the clock has a slow slew rate at the falling edge. Accordingly, the waveform obtained at the node 221A1 has a more obtuse falling edge than the waveform of the clock inP, and the waveform of the clock outP obtained at the node 221A2 has a further obtuse falling edge. Accordingly, the length of one cycle of the clock inP is prolonged.

When the capacity of the varactor 304A is reduced due to phase error detected by the PD 131 (see FIG. 8), the slow rate is increased, so the rising edge and falling edge of the clock inP are made acute. Accordingly, the length of one cycle of the clock inP is shortened.

As described above, when the PD 131 (see FIG. 8) detects phase error, the slew rates of both the rising edge and falling edge of the clock are changed as illustrated in FIG. 11A, causing a phase shift. Thus, the phase of the clock is adjusted.

A phase shift indicates an amount by which the phase of the clock outP has shifted with respect to the clock inP.

Next, a case in which a voltage is input from the loop filter 243 to the duty control terminal 305A according to the duty error detected by the PD 241 will be described with reference to FIG. 11B, and a case in which a voltage is input from the loop filter 243 to the duty control terminal 305B according to the duty error detected by the PD 241 will be described with reference to FIG. 11C.

In a case in which a voltage is input from the loop filter 243 into the duty control terminal 305A according to the duty error, FIG. 11B illustrates the waveform of the clock inP to be input into the input terminal 301A, the waveform 221A1 of the clock obtained at the node 221A1, and the waveform of the clock outP obtained at the node 221A2.

When the PD 241 detects duty error, the loop filter 243 outputs a voltage with a value based on the detected duty error.

When this voltage is input into the duty control terminal 305A, the gate voltage of the NMOS transistor 334A is controlled, so the value of a current that flows into the circuit formed by vertically stacking the PMOS transistor 331A, PMOS transistor 332A, NMOS transistor 333A, and NMOS transistor 334A in that order is controlled.

As a result, the value of the current in the circuit is controlled, the circuit being formed by vertically stacking the PMOS transistor 311A, PMOS transistor 312A, NMOS transistor 313A, and NMOS transistor 314A in that order, which forms a current mirror circuit together with the circuit formed by vertically stacking the PMOS transistor 331A, PMOS transistor 332A, NMOS transistor 333A, and NMOS transistor 334A in that order.

When a voltage is input from the loop filter 243 into the duty control terminal 305A according to the duty error, the gate voltage of the NMOS transistor 324A is also controlled, so the value of the output current from the NMOS transistor 324A is controlled.

The NMOS transistor 324A is a transistor involved in the falling edge, rather than the rising edge, of the clock inP to be input into the input terminal 301A.

Thus, as illustrated in FIG. 11B, as for the waveform obtained at the node 221A1, the form of only the rising edge is more obtuse than the falling edge of the clock inP; as for the clock outP output from the output terminal 302A, the form of only the falling edge is further obtuse. That is, the clock outP output from the output terminal 302A is a clock for which the slew rate of the rising edge has been adjusted. Thus, the duty ratio of the clock is adjusted.

The amount of adjustment of the slew rate of the rising edge indicates an amount (duty change) by which the duty cycle of the clock outP has been changed with respect to the clock inP.

In a case in which a voltage is input from the loop filter 243 into the duty control terminal 305B according to the duty error, FIG. 11C illustrates the waveform of the clock inN to be input into the input terminal 301B, the waveform 221B1 of the clock obtained at a node 221B1, and the waveform of the clock outN obtained at a node 221B2.

The node 221B1 is the output node of the CMOS circuit formed with the PMOS transistor 312B and NMOS transistor 313B. The node 221B2 is the output node of the CMOS circuit formed with the PMOS transistor 322B and NMOS transistor 323B.

When the PD 241 detects duty error, the loop filter 243 outputs a voltage with a value based on the detected duty error.

When this voltage is input into the duty control terminal 305B, the gate voltage of the NMOS transistor 334B is controlled, so the value of a current that flows into the circuit formed by vertically stacking the PMOS transistor 331B, PMOS transistor 332B, NMOS transistor 333B, and NMOS transistor 334B in that order is controlled.

As a result, the value of the current in the circuit is controlled, the circuit being formed by vertically stacking the PMOS transistor 321B, PMOS transistor 322B, NMOS transistor 332B, and NMOS transistor 324B in that order, which form a current mirror circuit together with the circuit formed by vertically stacking the PMOS transistor 331B, PMOS transistor 332B, NMOS transistor 333B, and NMOS transistor 334B in that order.

When a voltage is input from the loop filter 243 into the duty control terminal 305B according to the duty error, the gate voltage of the NMOS transistor 314B is also controlled, so the value of the output current from the NMOS transistor 314B is controlled.

The NMOS transistor 314B is a transistor involved in the falling edge, rather than the rising edge, of the clock inN to be input into the input terminal 301B.

Thus, as illustrated in FIG. 11C, as for the waveform obtained at the node 221B1, the form of only the falling edge is more obtuse than the rising edge of the clock inN; as for the clock outP output from the output terminal 302B, the form of only the falling edge is further obtuse.

That is, the clock outN output from the output terminal 302B is a clock for which the slew rate of the rising edge has been adjusted. Thus, the duty cycle of the clock is adjusted.

The amount of adjustment of the slew rate of the rising edge indicates an amount (duty change) by which the duty ratio of the clock outP has been changed with respect to the clock inP.

Accordingly, in the clock generator 200 in the second embodiment, the circuit 221A of the delay element 221 is operable to output the clock outP in which only the falling edge is obtuse when compared with the falling edge of the clock inP, and the circuit 221B of the delay element 221 is operable to output the clock outN in which only the rising edge is obtuse when compared with the rising edge of the clock inN.

This is also true for the delay elements 222 to 224 included in the delay circuit 220.

The PD 131, which is part of the DLL circuit, detects a phase difference between a rising edge of the clock to be input into one input terminal of the delay element 221 (the upper input terminal of the delay element 221 in FIG. 8) and the relevant rising edge of the clock output from one output terminal of the delay element 224 (the upper output terminal of the delay element 224 in FIG. 8).

That is, the PD 131 detects a phase difference between a rising edge the form of which is not obtuse (the slew rate has not been adjusted) and the relevant rising edge the form of which is not obtuse (the slew rate has not been adjusted).

However, the PD 241, which is part of the DCC, detects a phase difference between a rising edge of the clock to be input into one input terminal of the delay element 221 (the upper input terminal of the delay element 221 in FIG. 8) and the relevant falling edge of the clock output from one output terminal of the delay element 222 (the upper output terminal of the delay element 222 in FIG. 8).

The rising edge of the clock to be input into one input terminal of the delay element 221 (the upper input terminal of the delay element 221 in FIG. 8) is not obtuse (the slew rate has not been adjusted). However, the falling edge of the clock output from one output terminal of the delay element 222 (the upper output terminal of the delay element. 222 in FIG. 8) is obtuse (the slew rate has been adjusted).

The reason why the PD 241 detects the phase of the falling edge of the clock output from one output terminal of the delay element 222 (the upper output terminal of the delay element 222 in FIG. 8) is that the phase of this falling edge is equal to the phase of the rising edge of the clock output from the other output terminal of the delay element 222 (the lower output terminal of the delay element 222 in FIG. 8).

Accordingly, as with the PD 141 in the first embodiment, the PD 241 is operable to detect duty error of the clock CLK_INP.

As described above, the PD 131 detects a phase difference between a rising edge the form of which is not obtuse (the slew rate has not been adjusted) and the relevant rising edge the form of which is not obtuse (the slew rate has not been adjusted). However, the PD 241 detects a phase difference between a rising edge the form of which is not obtuse (the slew rate has not been adjusted) and the relevant falling edge the form of which is obtuse (the slew rate has been adjusted).

Thus, the loop of the DLL including the PD 131 and the loop of the DCC including the PD 241 have different loop response characteristics, suppressing interference between the DLL and the DCC.

With the clock generator 100 in the first embodiment, the cut-off frequency of the loop filter 133 included in the DLL has been made different from the cut-off frequency of the loop filter 143 included in the DCC so that the DLL and DCC have different response characteristics.

With the clock generator 200 in the second embodiment, however, the PD 241 detects a clock that has a slew rate different from the slew rate of the clock detected by the PD 131, so it is possible to have the DLL and the DCC have different response characteristics.

If, for example, the loop response characteristics of the DLL including the PD 131 is made faster than the loop response characteristics of the DCC including the PD 241, it is possible to provide the clock generator 200 that not only suppresses interference between the DLL and the DCC but also prioritizes clock phase adjustment by the DLL over duty ratio correction by the DCC.

As with the clock generator 100 in the first embodiment, the response characteristics of the DCC may be made faster than the response characteristics of the DLL. If interference therebetween is not problematic, the DCC and DLL may have the same response characteristics.

To achieve both clock phase adjustment by the DLL and duty ratio correction by the DCC, the PD 131 may detect clocks' falling edges instead of their rising edges and the PD 241 may detect a clock's falling edge instead of its rising edge and may detect a clock's rising edge instead of its falling edge.

This completes the descriptions of the clock generators in exemplary embodiments of the present disclosure. However, the present disclosure is not limited to the embodiments that have been specifically disclosed; many variations and changes are possible without departing from the scope of the claims.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A clock generator comprising:
   a delay circuit configured to have 2N delay stages, in which a delay time from a first delay stage of the 2N delay stages to a last delay stage of the 2N delay stages is set to a length of a time of one cycle of an input clock input to the delay circuit, N being an integer;
   a first phase detector configured to detect a first phase difference between the input clock to the first delay stage and an output clock from the last delay stage;
   a first charge pump configured to generate a first current according to the first phase difference;
   a first loop filter configured to adjust an amount of delay applied to each of the 2N delay stages, based on a first voltage obtained by integrating the first current;
   a second phase detector configured to detect a second phase difference between the input clock to the first delay stage and an output clock from an Nth delay stage;
   a second charge pump configured to generate a second current according to the second phase difference; and
   a second loop filter configured to adjust a duty ratio of an output clock from each of the 2N delay stages, based on a second voltage obtained by integrating the second current.

2. The clock generator according to claim 1, wherein a bandwidth of the first loop filter and a bandwidth of the second loop filter are mutually different.

3. The clock generator according to claim 1, wherein
   a size of transistor included in the first charge pump and a size of transistor included in the second charge pump are different, and
   a value of the first current generated by the first charge pump and a value of the second current generated by the second charge pump are different.

4. The clock generator according to claim 1, further comprising:
   a capacitor arranged on a front stage of the delay circuit, configured to cut off a direct current component of the input clock to the delay circuit; and
   a resistor, one end of which is connected to an output terminal of the second loop filter and another end of which is connected between an output terminal of the capacitor and an input terminal of the delay circuit,
   wherein the second loop filter adjusts the duty ratio of the output clock from the each delay stage in the delay circuit by superimposing, through the resistor, the second voltage on the input clock which is input to the delay circuit through the capacitor to adjust the direct current component of the input clock.

5. The clock generator according to claim 1, wherein
   the each delay stage of the delay circuit is an inverter of a differential input-and-output type that outputs output clocks for which a slew rate of a rising edge of one input clock and a slew rate of a falling edge of another input clock have been adjusted or a slew rate of a falling edge of one input clock and a slew rate of a rising edge of another input clock have been adjusted,
   the first phase detector detects a phase difference between a rising edge of one of differential input clocks to the inverter at the first stage and a rising edge of one of differential output clocks from the inverter at the last stage or a phase difference between a falling edge of one of differential input clocks to the inverter at the first delay stage and a falling edge of one of differential output clocks from the inverter at the last stage, and
   the second phase detector detects a phase difference between a rising edge of one of differential input clocks to the inverter at the first stage and a falling edge of one of differential output clocks from the inverter at the Nth stage or a phase difference between a falling edge of one of differential input clocks to the inverter at the first stage and a rising edge of one of differential output clocks from the inverter at the Nth stage.

6. The clock generator according to claim 1, further comprising:
   a first digital-to-analog converter configured to convert the amount of delay output from the first loop filter to an analog signal so as to provide the analog signal to the delay circuit, in a case that the first phase detector, the first charge pump and the first loop filter process a digital signal; and
   a second digital-to-analog converter configured to convert the amount of delay output from the second loop filter to an analog signal so as to provide the analog signal to the delay circuit, in a case that the second phase detector, the second charge pump and the second loop filter process a digital signal 7. A clock generator comprising:
   a delay circuit configured to have 4N delay stages, in which a delay time from a first delay stage of the 4N delay stages to a last delay stage is set to a length of a time of 2N cycles of an input clock input to the delay circuit, N being an integer;
   a first phase detector configured to detect a first phase difference between the input clock to the first delay stage and an output clock from the last delay stage;
   a first charge pump configured to generate a first current according to the first phase difference;
   a first loop filter configured to adjust an amount of delay applied to each of the 4N delay stages, based on a first voltage obtained by integrating the first current;
   a second phase detector configured to detect a second phase difference between the input clock to the first delay stage and an output clock from one of an Nth delay stage and a 3Nth delay stage;
   a second charge pump configured to generate a second current according to the second phase difference; and
   a second loop filter configured to adjust a duty ratio of an output clock from each of the 4N delay stages, based on the second voltage obtained by integrating the second current.

8. The clock generator according to claim 7, wherein a bandwidth of the first loop filter and a bandwidth of the second loop filter are mutually different.

9. The clock generator according to claim 7, wherein
a size of transistor included in the first charge pump and a size of transistor included in the second charge pump are different, and
a value of the first current generated by the first charge pump and a value of the second current generated by the second charge pump are different.

10. The clock generator according to claim 7, further comprising:
a capacitor arranged on a front stage of the delay circuit, configured to cut off a direct current component of the input clock to the delay circuit; and
a resistor, one end of which is connected to an output terminal of the second loop filter and another end of which is connected between an output terminal of the capacitor and an input terminal of the delay circuit,
wherein the second loop filter adjusts the duty ratio of the output clock from the each delay stage in the delay circuit by superimposing, through the resistor, the second voltage on the input clock which is input to the delay circuit through the capacitor to adjust the direct current component of the input clock.

11. The clock generator according to claim 7, wherein
the each delay stage of the delay circuit is an inverter of a differential input-and-output type that outputs output clocks for which a slew rate of a rising edge of one input clock and a slew rate of a falling edge of another input clock have been adjusted or a slew rate of a falling edge of one input clock and a slew rate of a rising edge of another input clock have been adjusted,
the first phase detector detects a phase difference between a rising edge of one of differential input clocks to the inverter at the first stage and a rising edge of one of differential output clocks from the inverter at the last stage or a phase difference between a falling edge of one of differential input clocks to the inverter at the first delay stage and a falling edge of one of differential output clocks from the inverter at the last stage, and
the second phase detector detects a phase difference between a rising edge of one of differential input clocks to the inverter at the first stage and a falling edge of one of differential output clocks from the inverter at the Nth stage or a phase difference between a falling edge of one of differential input clocks to the inverter at the first stage and a rising edge of one of differential output clocks from the inverter at the Nth stage.

12. The clock generator according to claim 7, further comprising:
a first digital-to-analog converter configured to convert the amount of delay output from the first loop filter to an analog signal so as to provide the analog signal to the delay circuit, in a case that the first phase detector, the first charge pump and the first loop filter process a digital signal; and
a second digital-to-analog converter configured to convert the amount of delay output from the second loop filter to an analog signal so as to provide the analog signal to the delay circuit, in a case that the second phase detector, the second charge pump and the second loop filter process a digital signal.

* * * * *